(12) United States Patent
Wahl et al.

(10) Patent No.: US 9,508,712 B2
(45) Date of Patent: Nov. 29, 2016

(54) SEMICONDUCTOR DEVICE WITH A MULTIPLE NANOWIRE CHANNEL STRUCTURE AND METHODS OF VARIABLY CONNECTING SUCH NANOWIRES FOR CURRENT DENSITY MODULATION

(71) Applicant: GLOBALFOUNDRIES Inc., Grand Cayman (KY)

(72) Inventors: Jeremy Austin Wahl, Delmar, NY (US); Nicholas Vincent LiCausi, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/146,075

(22) Filed: Jan. 2, 2014

(65) Prior Publication Data
US 2015/0187762 A1  Jul. 2, 2015

(51) Int. Cl.
| | |
|---|---|
| H01L 27/088 | (2006.01) |
| H01L 21/8234 | (2006.01) |
| H01L 23/34 | (2006.01) |
| H01L 29/423 | (2006.01) |
| H01L 29/66 | (2006.01) |
| H01L 29/775 | (2006.01) |
| H01L 29/06 | (2006.01) |

(52) U.S. Cl.
CPC ..... *H01L 27/088* (2013.01); *H01L 21/823412* (2013.01); *H01L 23/345* (2013.01); *H01L 29/0673* (2013.01); *H01L 29/42364* (2013.01); *H01L 29/66439* (2013.01); *H01L 29/775* (2013.01); *H01L 2924/0002* (2013.01)

(58) Field of Classification Search
USPC ........................................................ 977/938
See application file for complete search history.

(56) References Cited

U.S. PATENT DOCUMENTS

| | | | |
|---|---|---|---|
| 5,166,758 A | 11/1992 | Ovshinsky et al. | |
| 2012/0225527 A1* | 9/2012 | Elmegreen et al. | .......... 438/238 |
| 2012/0286227 A1* | 11/2012 | Chung | .............. 257/4 |
| 2013/0341704 A1 | 12/2013 | Rachmady et al. | |

OTHER PUBLICATIONS

Fallica et al., "Thermal and Electrical Characterization of Materials for Phase-Change Memory Cells," J. Chem. Eng. Data, 54:1698-1701,2009.
Taiwanese Office Action dated Apr. 22, 2016, for Taiwanese Patent Application No. 103142320, filed on Dec. 5, 2014.

* cited by examiner

*Primary Examiner* — Yu Chen
*Assistant Examiner* — Nilufa Rahim
(74) *Attorney, Agent, or Firm* — Amerson Law Firm, PLLC

(57) ABSTRACT

A nanowire device is disclosed that includes first and second nanowires, a gate structure positioned around a portion of the first and second nanowires and a phase change material surrounding at least a portion of the first nanowire in the source/drain regions of the device but not surrounding the second nanowire in the source/drain regions.

18 Claims, 8 Drawing Sheets

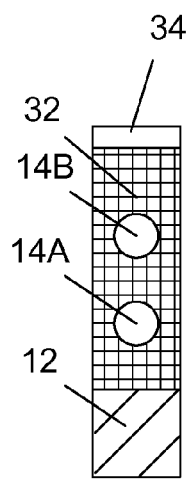
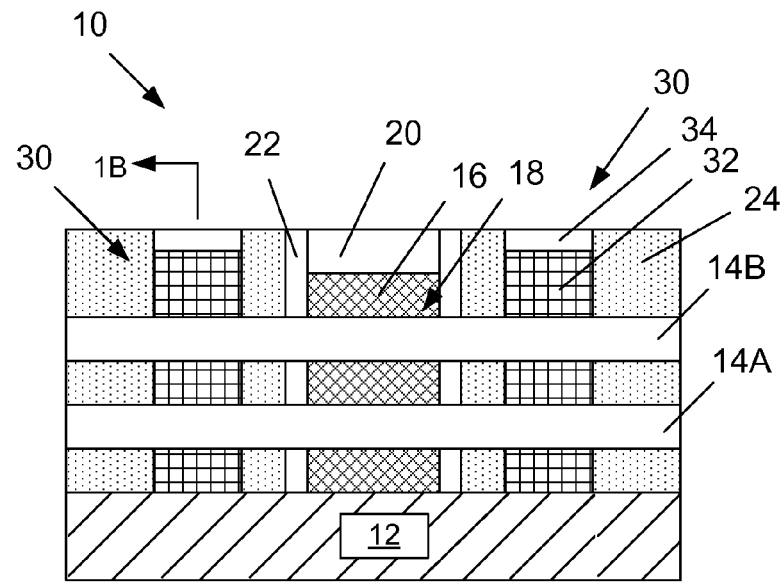
Fig. 1B  Fig. 1A (Prior Art)
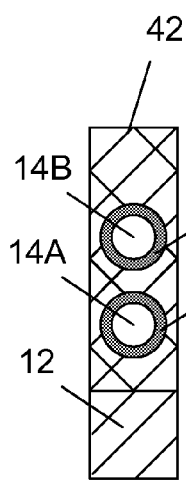
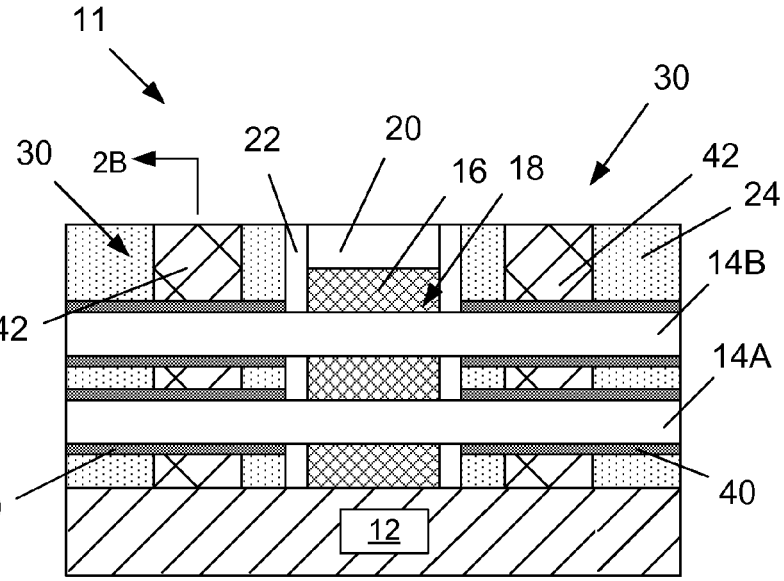
Fig. 2B  Fig. 2A (Prior Art)

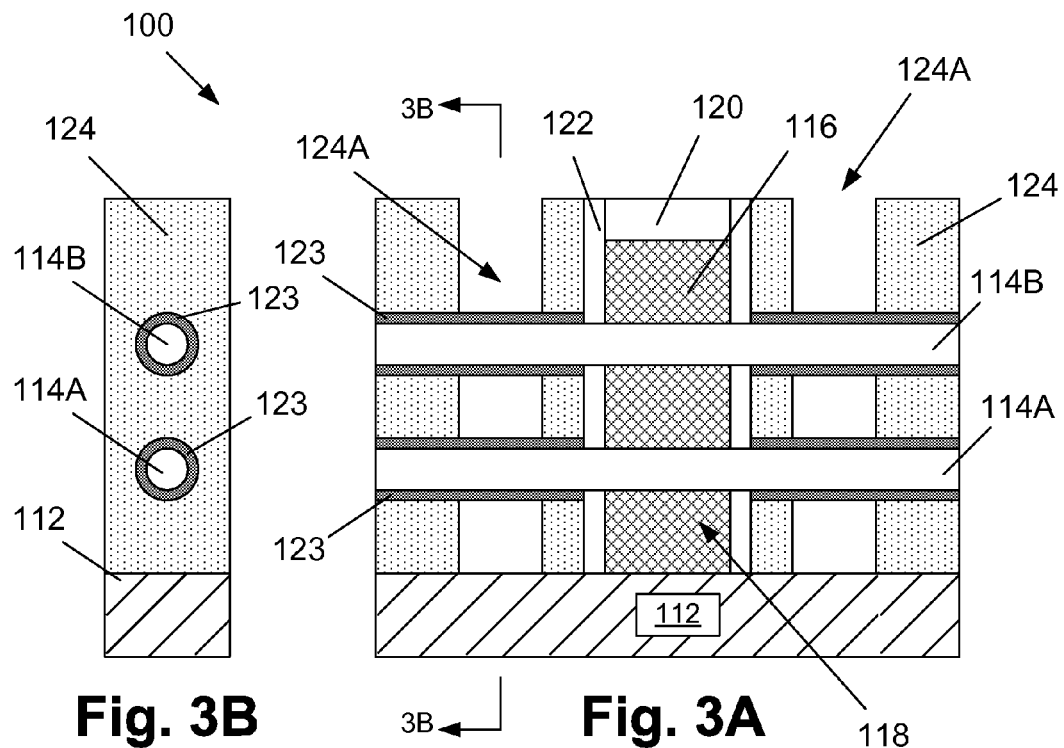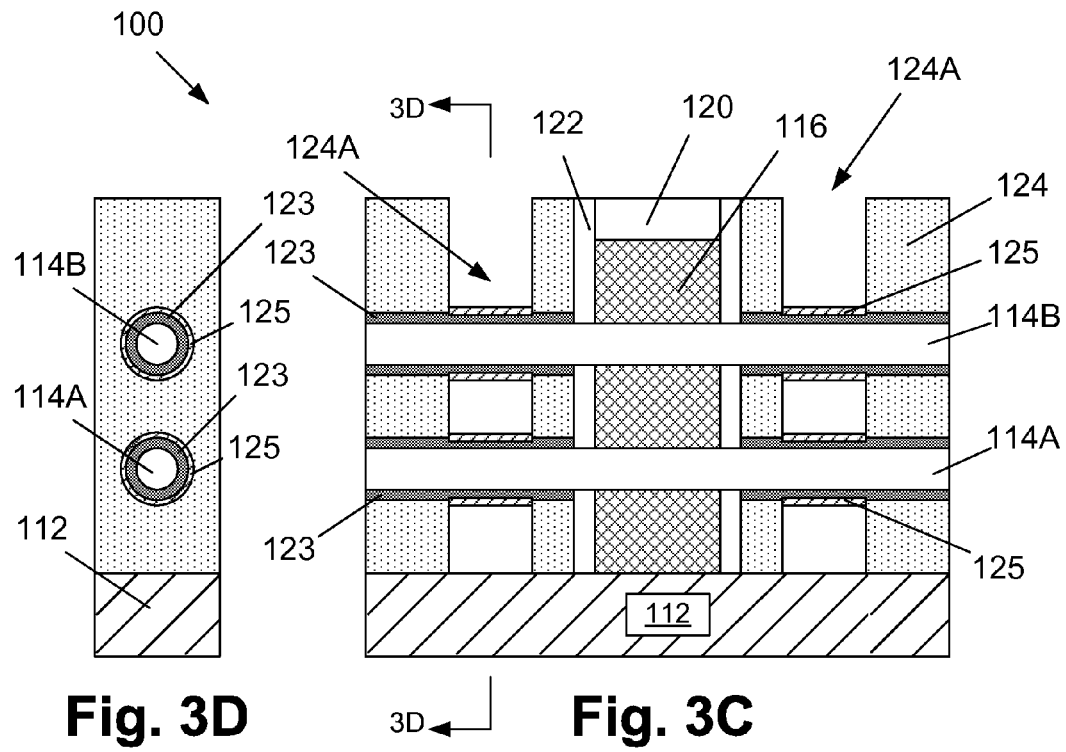

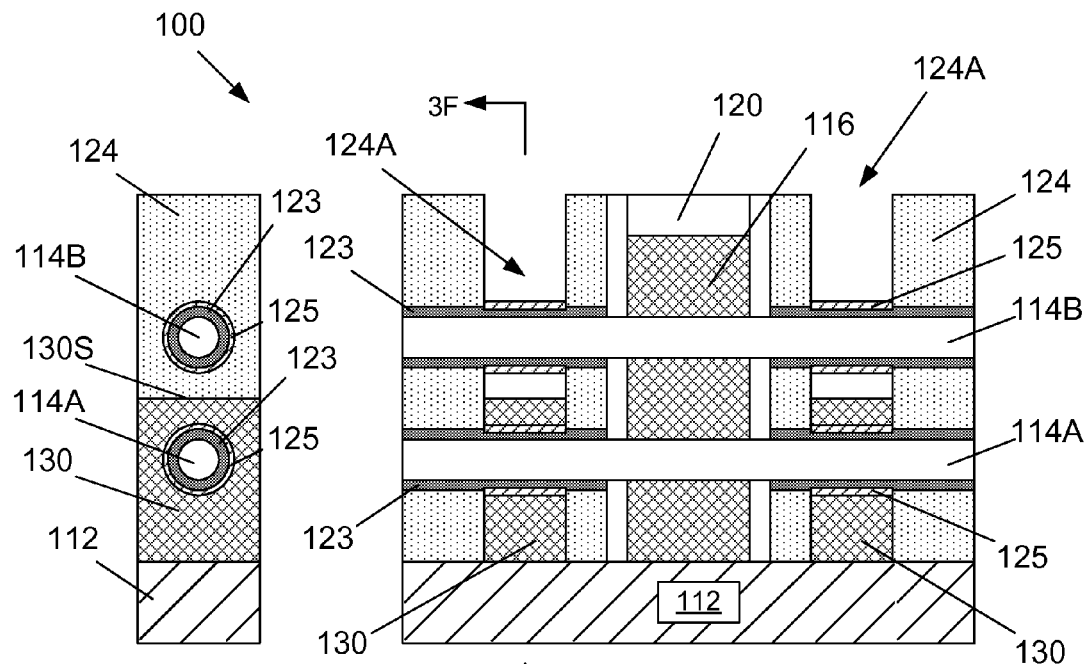
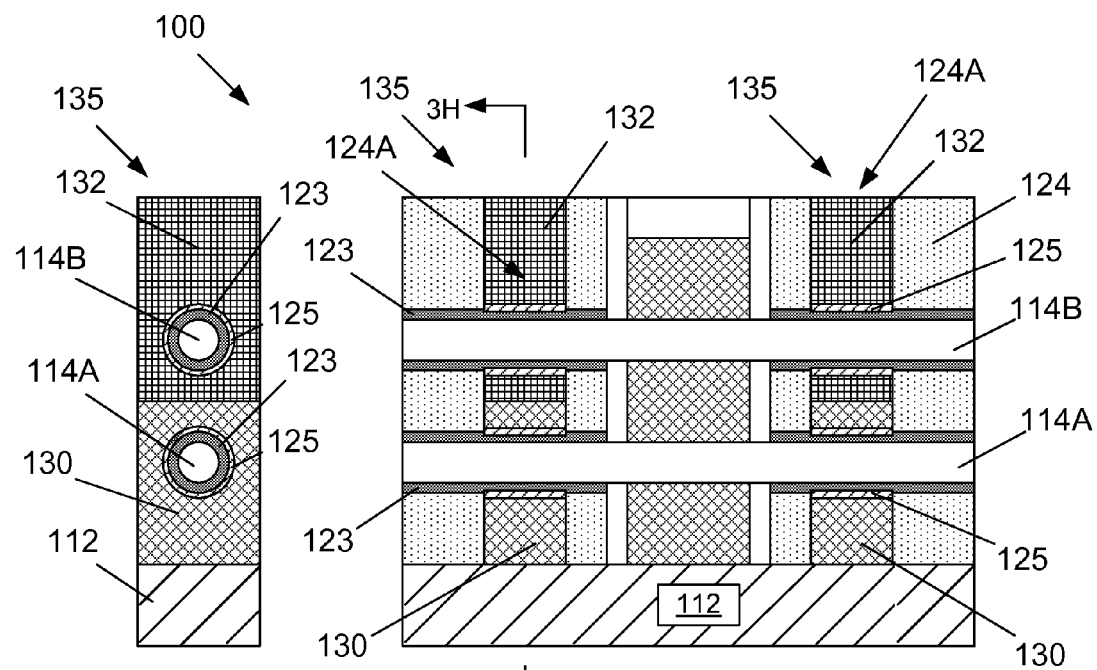

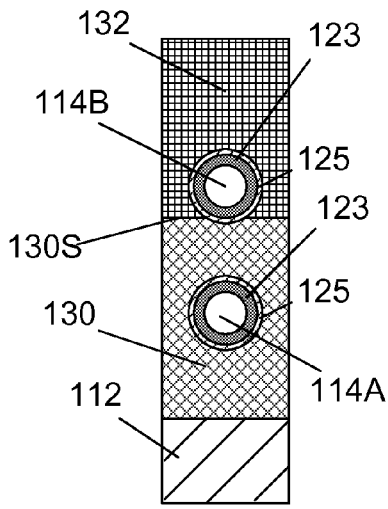
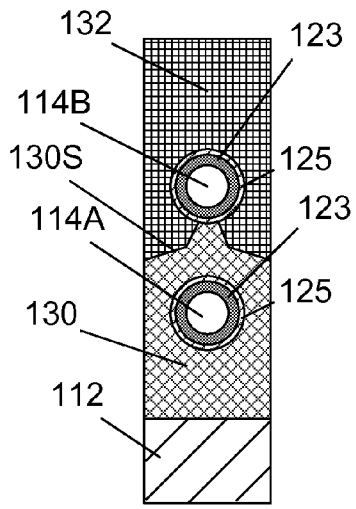
Fig. 3I          Fig. 3J
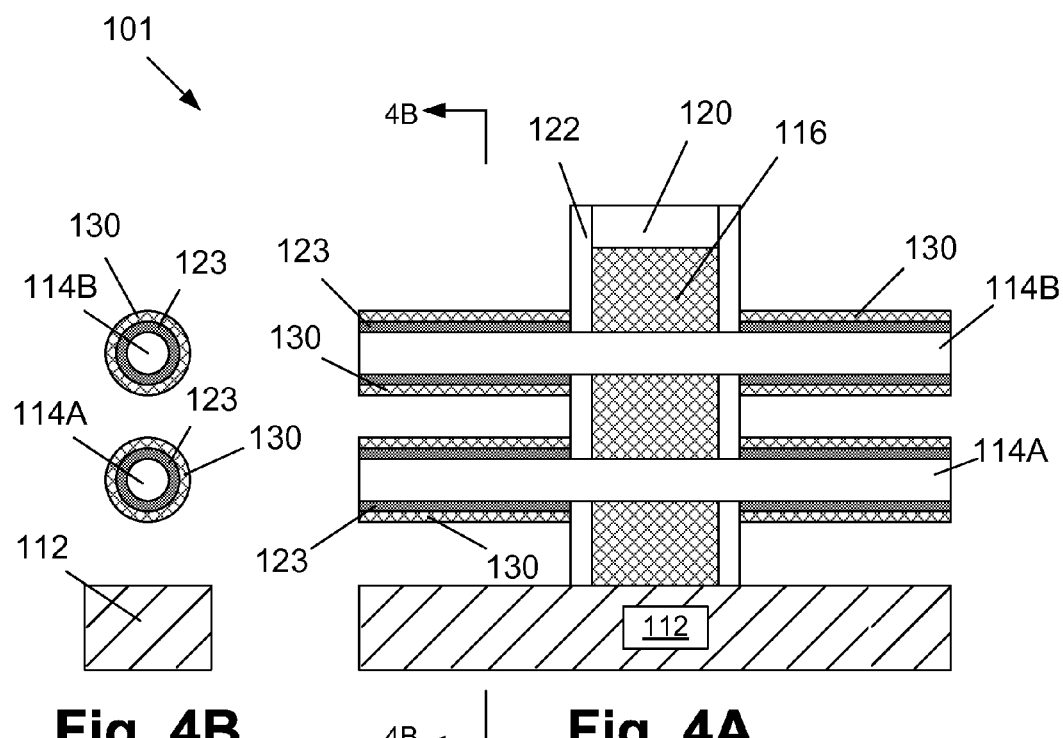
Fig. 4B          Fig. 4A

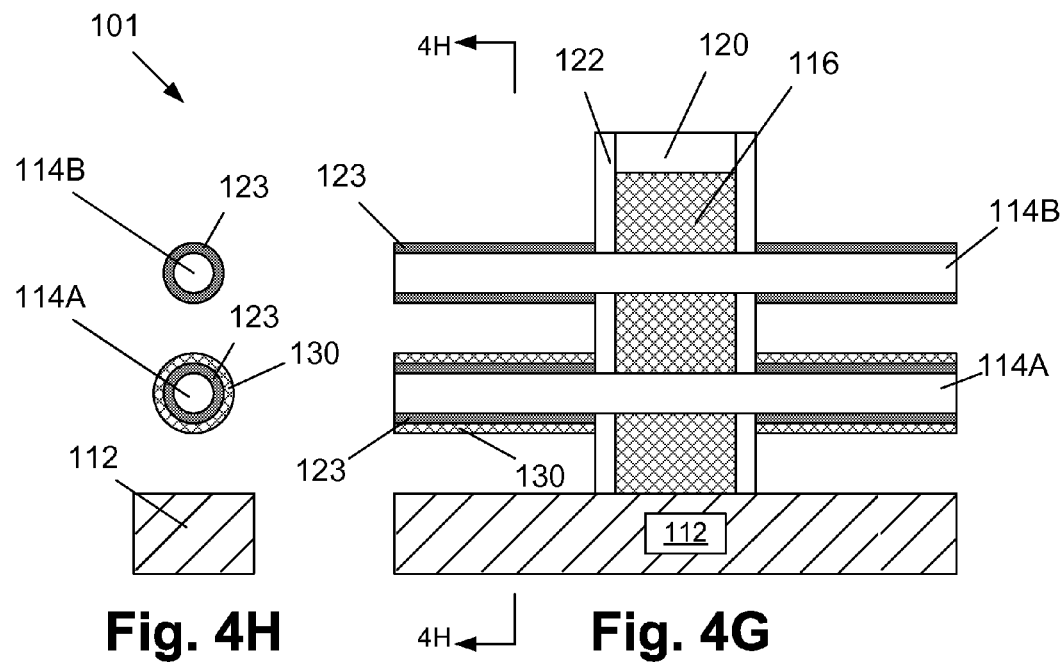
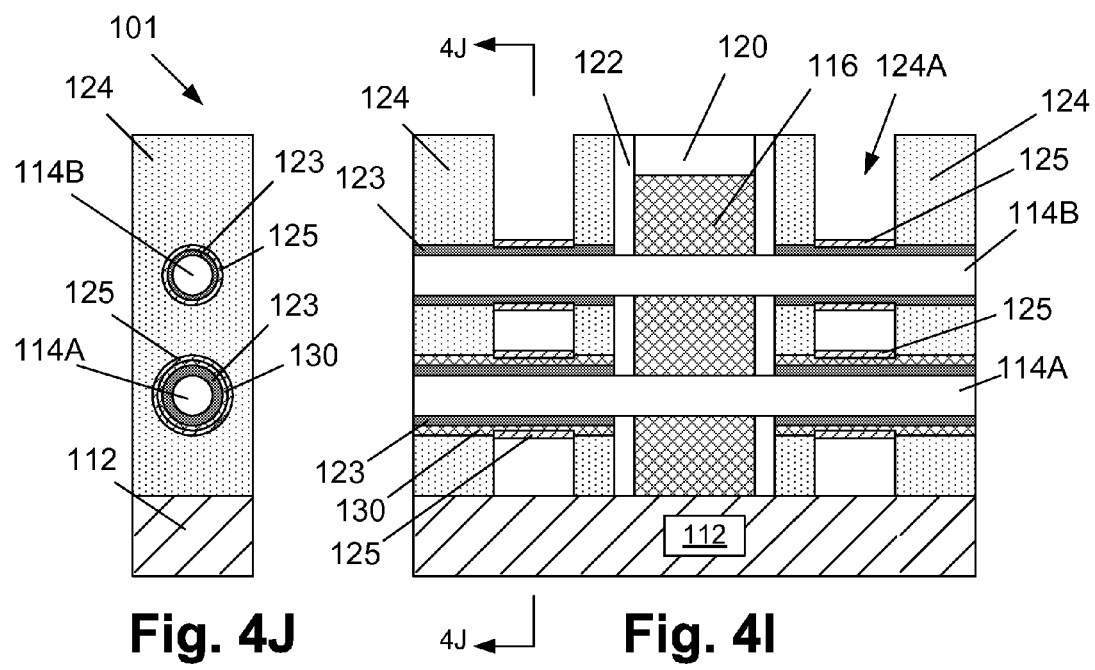

SEMICONDUCTOR DEVICE WITH A MULTIPLE NANOWIRE CHANNEL STRUCTURE AND METHODS OF VARIABLY CONNECTING SUCH NANOWIRES FOR CURRENT DENSITY MODULATION

BACKGROUND OF THE INVENTION

1. Field of the Invention

Generally, the present disclosure relates to the manufacture of semiconductor devices, and, more specifically, to various semiconductor devices having a multiple nanowire channel structure and methods of variably connecting the nanowires for current density modulation purposes.

2. Description of the Related Art

The fabrication of advanced integrated circuits, such as CPUs, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by controlling the voltage applied to the gate electrode. For example, for an NMOS device, if there is no voltage applied to the gate electrode, then there is no current flow through the NMOS device (ignoring undesirable leakage currents, which are relatively small). However, when an appropriate positive voltage is applied to the gate electrode, the channel region of the NMOS device becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to the device described above, which has a planar structure, there are so-called 3D devices, such as an illustrative FinFET device, which is a three-dimensional structure. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the substrate so as to reduce the physical size of the semiconductor device. Also, in a FinFET, the junction capacitance at the drain region of the device is greatly reduced, which tends to reduce at least some short channel effects. When an appropriate voltage is applied to the gate electrode of a FinFET device, the surfaces (and the inner portion near the surface) of the fins, i.e., the substantially vertically oriented sidewalls and the top upper surface of the fin with inversion carriers, contributes to current conduction. In a FinFET device, the "channel-width" is approximately two times (2×) the vertical fin-height plus the width of the top surface of the fin, i.e., the fin width. Multiple fins can be formed in the same foot-print as that of a planar transistor device. Accordingly, for a given plot space (or foot-print), FinFETs tend to be able to generate significantly stronger drive current than planar transistor devices. Additionally, the leakage current of FinFET devices after the device is turned "OFF" is significantly reduced as compared to the leakage current of planar FETs due to the superior gate electrostatic control of the "fin" channel on FinFET devices. In short, the 3D structure of a FinFET device is a superior MOSFET structure as compared to that of a planar FET, especially in the 20-nm CMOS technology node and beyond.

Another known transistor device is typically referred to as a nanowire device. In a nanowire device, at least the channel region of the device is comprised of one or more very small diameter, wire-like semiconductor structures. As with the other types of transistor devices discussed above, current flow through a nanowire device is controlled by controlling the voltage applied to the gate electrode. When an appropriate voltage is applied to the gate electrode, the channel region of the nanowire device becomes conductive, and electrical current is permitted to flow between the source region and the drain region through the conductive channel region, i.e., current flows through the nanowire structure. Persons skilled in the art will recognize that there are various known techniques that may be employed to manufacture such nanowire devices. Accordingly, the processing details for forming a basic nanowire device structure will not be described in detail herein.

There are several techniques by which electrical contact is made to the nanowire structures in the source/drain regions of a nanowire device. FIGS. 1A-1B depict one illustrative nanowire device 10 that will be referenced to describe one prior art technique for contacting the nanowires in the source/drain regions of the nanowire device 10. In general, the nanowire device 10 is formed above a layer of insulating material 12. In the depicted example, the nanowire device 10 includes first and second nanowires 14A, 14B, a schematically depicted gate structure 16 (that includes a gate insulation layer and a gate electrode), a gate cap layer 20 and sidewall spacers 22. When in operation, a channel region 18 will form in the portions of the nanowire structures 14A, 14B surrounded by the gate structure 16. Also depicted in FIGS. 1A-1B are illustrative source/drain connecting structures 30 that are formed in a layer of insulating material 24. In the embodiment shown in FIGS. 1A-1B, the source/drain connecting structures 30 are comprised of an epi semiconductor material 32 and a metal silicide region 34. Ultimately, conductive contacts (not shown) will be formed to make contact to the source/drain connecting structures 30.

FIGS. 2A-2B depict another illustrative nanowire device 11 that will be referenced to describe another prior art technique for contacting the nanowires in the source/drain regions of the nanowire device 11. In general, the nanowire device 11 has the same basic structure as that described above for the nanowire device 10. Thus, only certain differences will be noted for the nanowire device 11 relative to the nanowire device 10. In the nanowire device 11, after the gate structure 16, cap layer 20 and spacers 22 are formed, an epi semiconductor material 40 is formed around the exposed portions of the nanowires 14A, 14B, i.e., the portions positioned outside of the spacers 22. Thereafter, the layer of insulating material 24 is formed and patterned to define openings that expose portions of the nanowires 14A, 14B. In the nanowire device 11, the source/drain connecting structures 30 are comprised of a traditional contact metal 42, such as tungsten, that is deposited in the openings in the layer of insulating material 24.

In general, many if not all transistor devices are designed such that they can deliver the maximum performance, e.g., the maximum drive current, when needed by a particular circuit operating in a peak-demand situation or condition. However, in practice, an integrated circuit product does not continuously function in such peak-demand conditions. In practice, an integrated circuit product has periods of operation that fluctuate between full-performance, peak-demand requirements and lesser-performance requirements. Unfortunately, since the transistors are designed to operate for peak-demand conditions, they still produce the same amount of drive current even when the integrated circuit is operating in less than peak-demand situations. In short, there are times during the operation of an integrated circuit product that a "lower" performance transistor device, i.e., one producing a relatively lower drive current, would function equally as well as a higher performance transistor. Unfortunately, since the transistors are designed for peak-demand situations, there is no effective way to adjust or "tune" the drive current produced by the transistor based upon the then-current operational demands of the integrated circuit product. Accordingly, operating such high performance transistor devices during periods where the integrated circuit could function with a transistor that produces a lesser drive current represents an undesirable consumption of power. Conservation of power is particularly important in many mobile devices, e.g., cell phones, portable laptops, etc., so as to extend battery life.

The present disclosure is directed to various semiconductor devices having a multiple nanowire channel structure and methods of variably connecting the nanowires for current density modulation purposes that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various semiconductor devices having a multiple nanowire channel structure and methods of variably connecting the nanowires for current density modulation purposes. One illustrative nanowire device disclosed herein includes, among other things, a first nanowire, a second nanowire positioned above the first nanowire, a gate structure positioned around a portion of the first and second nanowires and a phase change material surrounding at least a portion of the first nanowire in the source/drain regions of the device but not surrounding the second nanowire in the source/drain regions.

One illustrative method disclosed herein of forming a nanowire device includes, among other things, forming at least first and second nanowires, forming a gate structure around a portion of the first and second nanowires, forming a phase change material that surrounds the first nanowire but does not surround the second nanowire in the source/drain regions of the device and forming conductive structures that are conductively coupled to the phase change material that surrounds the first nanowire and conductively coupled to the second nanowire.

BRIEF DESCRIPTION OF THE DRAWINGS

The disclosure may be understood by reference to the following description taken in conjunction with the accompanying drawings, in which like reference numerals identify like elements, and in which:

FIGS. 1A-1B depict one illustrative prior art nanowire device;

FIGS. 2A-2B depict another illustrative prior art nanowire device;

FIGS. 3A-3J depict one illustrative embodiment of a nanowire device described herein;

FIGS. 4A-4L depict another illustrative embodiment of a nanowire device described herein.

Figures 4C, 4D:
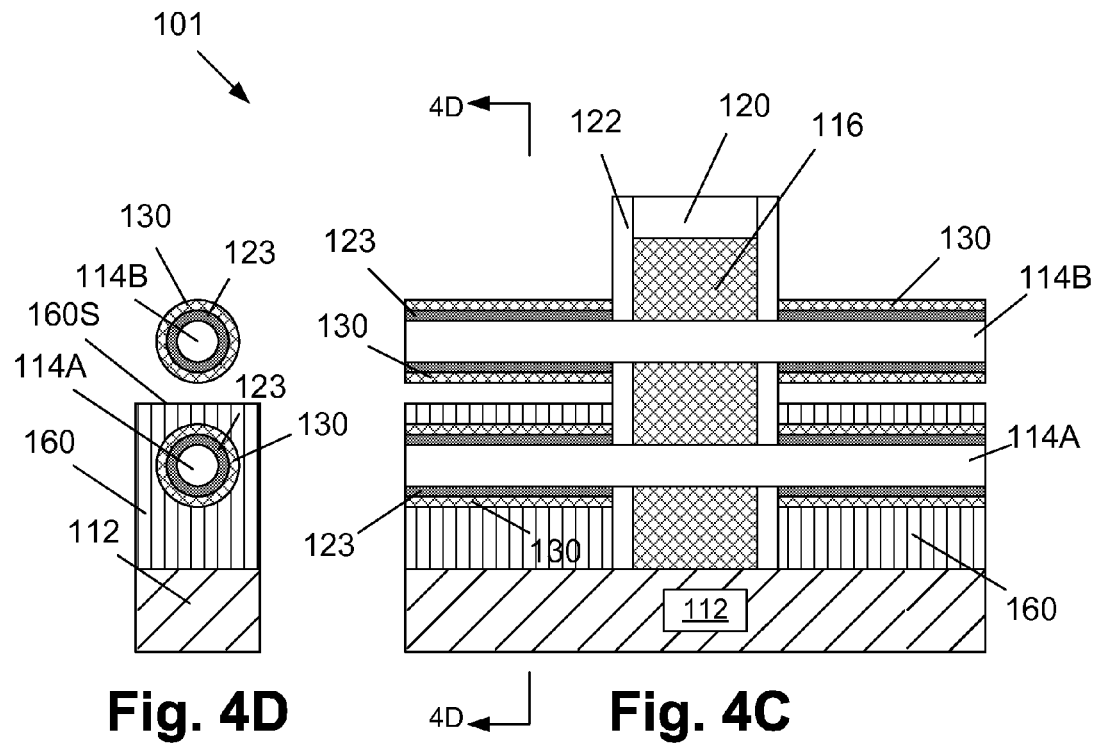

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various semiconductor devices having a multiple nanowire channel structure and methods of variably connecting the nanowires for current density modulation purposes. As will be readily apparent to those skilled in the art upon a complete reading of the present application, the present method is applicable to a variety of devices, including, but not limited to, logic devices, memory devices, etc., and the methods disclosed herein may be employed to form N-type or P-type semiconductor devices. In the examples shown below, the depicted layers of material may be formed by performing a variety of known processing techniques, such as a chemical vapor deposition (CVD) process, an atomic layer deposition (ALD) process, an epitaxial deposition process (EPI), or plasma enhanced versions of such processes, and the thickness of such a layer(s) may vary depending upon the particular application.

FIGS. 3A-3J depict one illustrative embodiment of a nanowire device 100 described herein. In general, the nanowire device 100 is formed above a layer of insulating material 112. In the depicted example, the nanowire device 100 includes first and second nanowires 114A, 114B, a schematically depicted gate structure 116 (that includes a gate insulation layer and a gate electrode, neither of which are separately shown), a gate cap layer 120 and sidewall spacers 122. In operation, a channel region 118 will form in the portions of the nanowire structures 114A, 114B surrounded by the gate structure 116, i.e., when an appropriate voltage is applied to the gate electrode, the channel region 118 of the nanowire device 100 becomes conductive, and electrical current is permitted to flow between the source region and the drain region through the nanowire structures 114A, 114B. The nanowires 114A, 114B may be of any desired size or cross-sectional configuration and they may be formed by performing a variety of known techniques. The approximate diameter of the nanowires 114A, 114B may vary depending upon the particular application, e.g., in one example, the diameter may be about 5-18 nm. The gate structure 116 may be formed using either so-called "gate-first" or "replacement gate" manufacturing techniques. Persons skilled in the art will recognize that there are various known techniques that may be employed to manufacture such basic nanowire devices. Accordingly, the processing details for forming a basic nanowire device structure will not be described in detail herein. In the examples depicted herein, the nanowire devices will include two illustrative nanowires. However, as will be appreciated by those skilled in the art after a complete reading of the present application, nanowire devices having more than the depicted two nanowires may be formed and operated using the techniques disclosed herein. Of course, the present inventions should not be considered to be limited to the illustrative examples depicted herein.

With continuing reference to FIGS. 3A-3B, the nanowire device 100 is depicted after several process operations were performed. First, an epitaxial deposition process was performed to form an epi semiconductor material 123 around the exposed portions of the nanowires 114A, 114B, i.e., the portions positioned outside of the spacers 122. Thereafter, a layer of insulating material 124 was formed and patterned using traditional photolithography and etching techniques to define openings 124A that expose portions of the nanowires 114A, 114B (with the epi material 123 positioned thereon). In one illustrative embodiment, the epi semiconductor material 123, may be silicon, germanium or silicon-germanium ($Si_xGe_{1-x}$), silicon carbide ($Si_xC_{1-x}$), a so-called III-V material (such as GaAs, GaInAs), etc., and its radial thickness may vary depending upon the particular application, e.g., 2-6 nm. The layer of insulating material 124 may be formed from any of a variety of different materials, e.g., silicon dioxide, and it may be formed using a variety of processing techniques, e.g., chemical vapor deposition, etc. The size and configuration of the openings 124A may also vary depending upon the particular application.

FIGS. 3C-3D depict the nanowire device 100 after a metal silicide material 125 was formed on the epi semiconductor material 123 within the openings 124A in the layer of insulating material 124. The metal silicide regions 125 depicted herein may be made using a variety of different refractory metals, e.g., nickel, platinum, cobalt, etc., or combinations thereof, and they may be formed using techniques that are well known to those skilled in the art. The typical steps performed to form metal silicide regions are: (1) depositing a layer of refractory metal; (2) performing an initial heating process causing the refractory metal to react with underlying silicon-containing material; (3) performing an etching or cleaning process to remove unreacted portions of the layer of refractory metal; and (4) performing an additional heating process to form the final phase of the metal silicide. The details of such silicidation processes are well known to those skilled in the art. In the illustrative example depicted herein, the metal silicide regions 125 may be formed by initially performing a highly-conformal atomic layer deposition (ALD) process or a RF physical vapor deposition (PVD) process to deposit a layer of, for example, nickel or another refractory metal, Thereafter, the anneal-etch-anneal process sequence described above is performed to complete the formation of the metal silicide regions 125. In one illustrative embodiment, the metal silicide regions 125 may have a radial thickness of about 2-3 nm.

FIGS. 3E-3F depict the nanowire device 100 after a chalcogenide material, a semiconductor class of phase-change materials (hereinafter referred to as "PCM") 130 was formed within the openings 124A such that its upper surface 130S covers the lower nanowire 114A. The PCM material 130 is a material that can be changed from an electrically conducting state (or phase) to a substantially electrically non-conducting state (or phase) by the application of heat. For example, for at least some PCM materials, the application of sufficient heat causes the crystalline structure of the material to change from a highly-conductive crystalline state to a highly-resistive (non-conductive) state. One illustrative method for applying heat to the PCM material 130 will be described more fully below. In general, the PCM material 130 is a material that exhibits a decrease in electrical conductivity of at least $10^4$ (in magnitude) when a chalcogenide, the phase change material, is heated from 25° C. to 300° C. In one illustrative embodiment, the PCM material 130 may be germanium-antimony-tellurium (GST ($Ge_2Sb_2Te_5$), $Te_{81}Ge_{15}S_2As_2$, $Te_{81}Ge_{15}S_2Sb_2$, other such PCM materials identified in U.S. Pat. No. 5,166,758, which is hereby incorporated by reference in its entirety, etc. To arrive at the structure depicted in FIGS. 3E-3F, the PCM material 130 may be deposited so as to over-fill the openings 124A and thereafter an etching process (or polishing and etching process) may be performed to remove portions of the PCM material 130 such that its upper surface 130S is positioned at the desired location, i.e., covering the nanowire 114A, within the opening 124A and below the second nanowire 114B. That is, the PCM material 130 is formed such that it covers or surrounds the lower nanowire 114A (i.e., the nanowire 114A and the materials surrounding the lower nanowire 114A) and it does not surround the upper nanowire 114B. In one illustrative embodiment, the PCM material 130 may be formed by performing a PVD process or an ALD process. The etching process that is performed to recess the PCM material 130 may be either a dry or wet etching process. Note that, in this example, the PCM material 130 only surrounds a portion of the axial length of the first nanowire 114A in the source/drain regions of the device 100, i.e., in the areas laterally outside of the spacers 122.

FIGS. 3G-3H depict the nanowire device 100 after a conductive material 132, such as a traditional contact metal like tungsten, was formed in the openings 124A in the layer of insulating material 124. The conductive material 132 is conductively coupled to the nanowire structure 114B and to the PCM material 130. To arrive at the structure depicted in FIGS. 3G-3H, the conductive material 132 may be deposited so as to over-fill the remaining portions of the openings 124A. Thereafter, a planarization process, such as a CMP process or an etch-back process, may be performed to remove the excess portions of the conductive material 132 that is positioned outside of the openings 124A. This completes the formation of the source/drain connecting structures 135 (comprised of at least the conductive material 132 and the PCM material 130) that are positioned in the layer of insulating material 124. At this point, traditional manufacturing techniques may be performed to complete the manufacture of the device 100. For example, conductive contacts (not shown) will be formed to make contact to the source/drain connecting structures 135. Additional contacts and metallization layers may then be formed above the device 100 using traditional techniques.

FIGS. 3I-3J depict possible alternative configurations of the PCM material 130 that is formed within the openings 124A. In FIG. 3I, the recess etching process was performed such that the upper surface 130S of the PCM material 130 is at a level such that it contacts at least a portion of the conductive material positioned around the nanowire 114B. Such a configuration may occur in an effort to insure that the lower nanowire 114A is completely covered. FIG. 3J depicts the situation where the etch-back process performed on the PCM material 130 may not be truly isotropic in nature such that a portion of the upper surface 130S of the PCM material 130 contacts the conductive material positioned around the nanowire 114B.

FIGS. 4A-4L depict another illustrative embodiment of a nanowire device 101 described herein. In general, the nanowire device 101 has the same basic structure as that described above for the nanowire device 100. Thus, only certain differences will be noted for the nanowire device 101 relative to that of the nanowire device 100.

With reference to FIGS. 4A-4B, the nanowires 114A, 1114B, gate structure 116, cap layer 120 and spacers 122 were formed using traditional manufacturing techniques. Thereafter, an epitaxial deposition process was performed to form the above-described epi semiconductor material 123 around the exposed portions of the nanowires 114A, 114B, i.e., the portions of the nanowires 114A, 114B positioned outside of the spacers 122. Then, the above-described PCM material 130 was formed on the epi semiconductor material 123. In one embodiment, the PCM material 130 may be formed by performing a selective CVD or an ALD process.

FIGS. 4C-4D depict the nanowire device 101 after several process operations were performed. First, a sacrificial material layer 160 was formed on the device 101 such that its upper surface 160S covers the lower nanowire 114A (i.e., it covers the nanowire 114A and the conductive material surrounding the lower nanowire 114A). The sacrificial material 160 may be comprised of a variety of different materials, e.g., OPL (organic/optical planarizing layer), photoresist, amorphous carbon, silicon dioxide, or any other material whose removal is highly selective to the other materials present, etc. The structure depicted in FIGS. 4C-4D may be achieved by depositing (or spin-coating) the sacrificial material 160 to the desired thickness or by over-filling the area adjacent the gate structure 116 and thereafter performing an etching process to remove portions of the sacrificial material 160 such that its upper surface 160S is positioned at the desired location, i.e., covering the lower nanowire 114A.

Figures 4E, 4F:
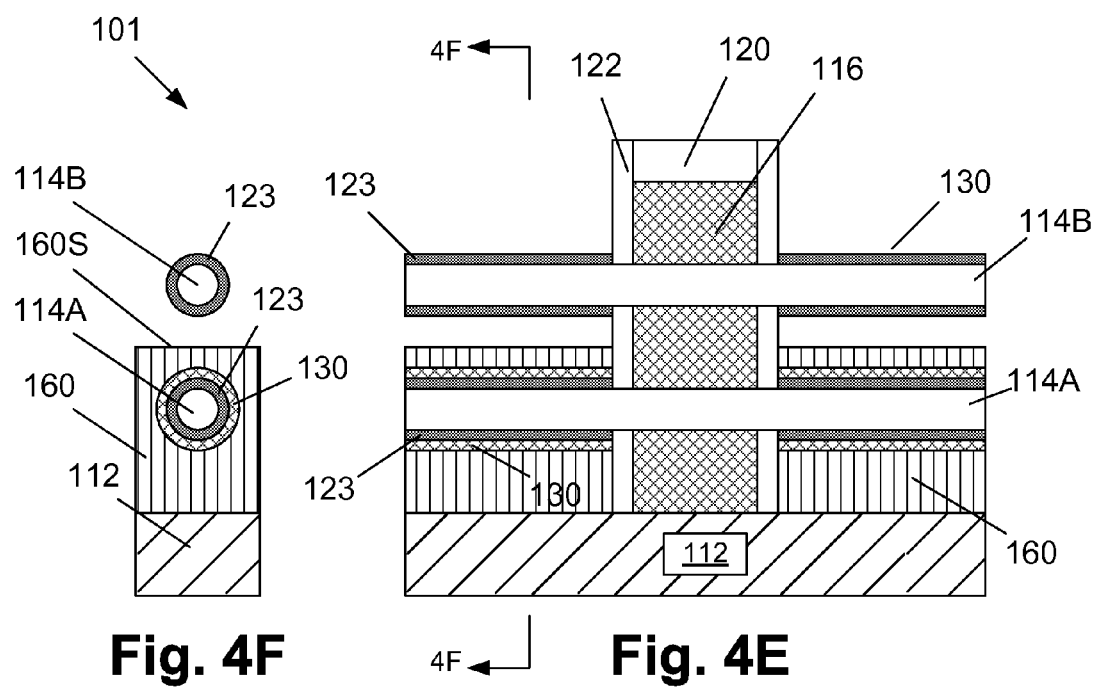

FIGS. 4E-4F depict the device 101 after an etching process was performed to remove the PCM material 130 from around the upper nanowire structure 114B. During this etching process, the sacrificial material 160 protects the PCM material 130 formed around the lower nanowire 114A. Note that, in this example, the PCM material 130 surrounds the entire axial length of the first nanowire 114A in the source/drain regions of the device 101, i.e., in the areas laterally outside of the spacers 122.

FIGS. 4G-4H depict the device 101 after an etching or stripping process was performed to remove the sacrificial material 160.

FIGS. 4I-4J depict the nanowire device 101 after several process operations were performed. First, the above-described layer of insulating material 124 was formed and patterned using traditional photolithography and etching techniques to define the openings 124A that expose portions of the nanowires 114A, 114B. Next, the above-described metal silicide material 125 was formed on the epi semiconductor material 123 positioned around the upper nanowire 114B and on the PCM material 130 positioned around the lower nanowire 114A within the openings 124A in the layer of insulating material 124.

Figures 4K, 4L:
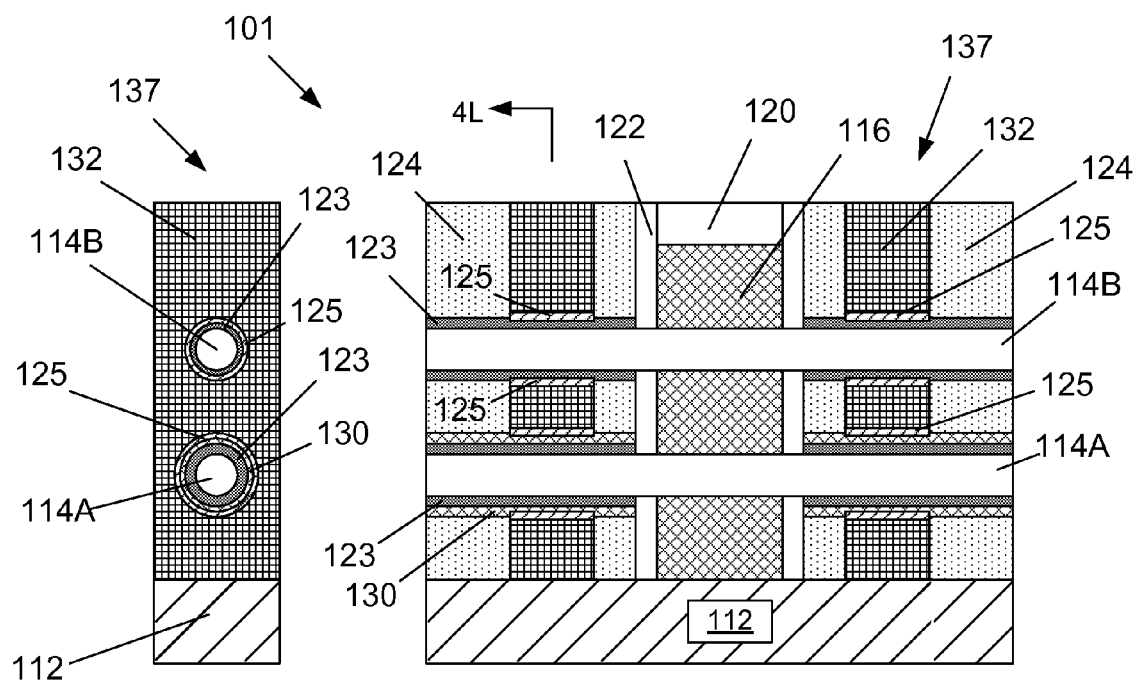

FIGS. 4K-4L depict the nanowire device 101 after the above-described conductive material 132 was formed in the openings 124A in the layer of insulating material 124. Note that the PCM material 130 is positioned between the conductive material 132 and the lower nanowire 114A. To arrive at the structure depicted in FIGS. 4K-4L, the conductive material 132 may be deposited so as to over-fill the openings 124A. Thereafter, a planarization process, such as a CMP process or an etch-back process, may be performed to remove the excess portions of the conductive material 132 that is positioned outside of the openings 124A. This completes the formation of the source/drain connecting structures 137 (comprised of at least the conductive material 132 and the PCM material 130) that are positioned in the layer of insulating material 124. At this point, traditional manufacturing techniques may be performed to complete the manufacture of the device 101. For example, conductive contacts (not shown) will be formed to make contact to the source/drain connecting structures 137. Additional contacts and metallization layers may then be formed above the device 101 using traditional techniques.

Figure 5A:
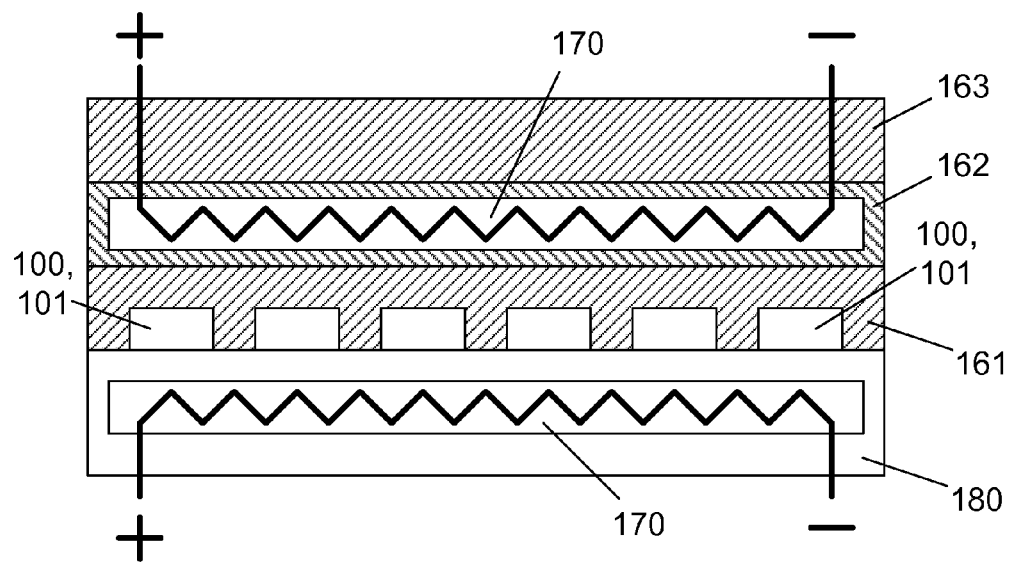
FIGS. 5A-5B depict various illustrative embodiments of the illustrative nanowire device described herein and their manner of operation.
Figure 5B:
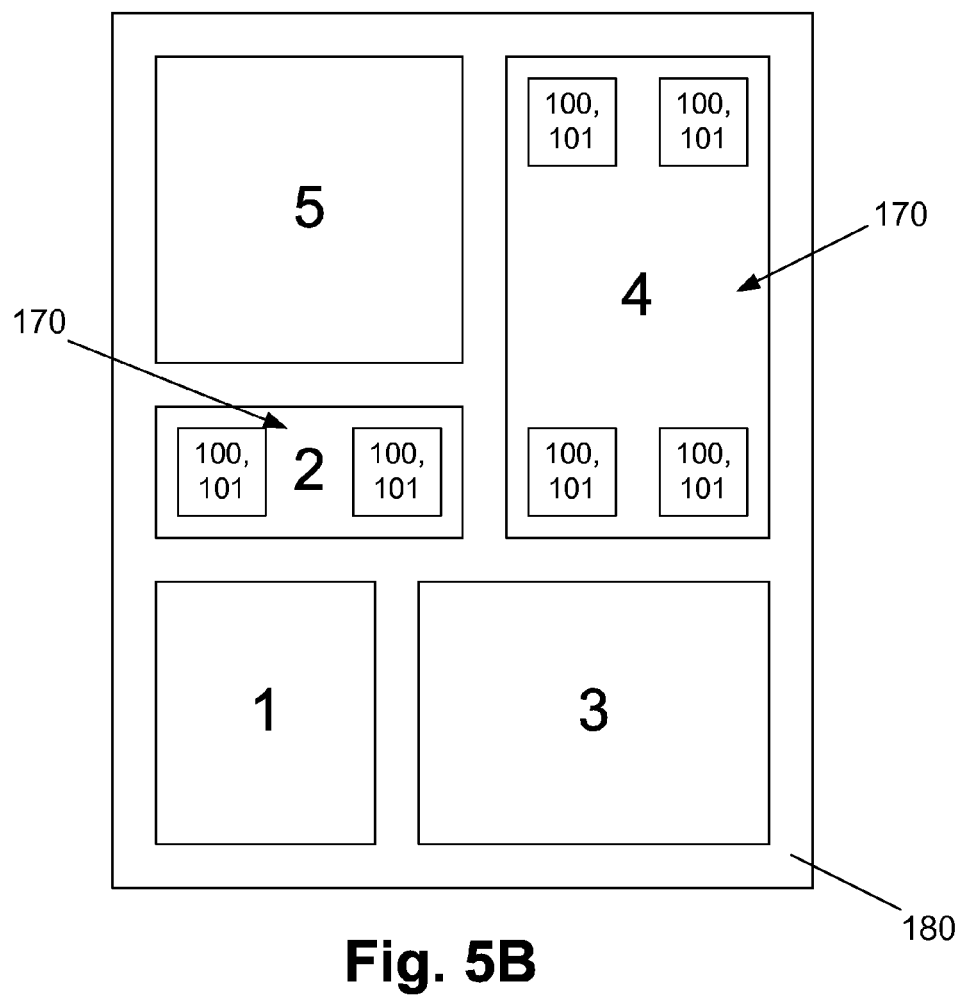

FIGS. 5A-5B depict various illustrative embodiments of integrated circuits that incorporate the illustrative nanowire devices 100 and/or 101 described herein and their manner of operation. As indicated above, the PCM material 130 is a material that can be changed from an electrically conducting state (or phase) to a substantially electrically non-conducting state (or phase) by the application of heat. FIG. 5A is a schematic depiction of one illustrative embodiment of an integrated circuit wherein heat may be applied to the PCM material 130 to accomplish the desired change in electrical conductivity (i.e., from electrically conductive state to substantially non-conductive state). FIG. 5A depicts an illustrative single die 180 with a plurality of the nanowire devices 100 and/or 101 formed above a single die 180. Also depicted are illustrative layers of insulating material 161, 162, 163 formed above the devices 100/101. The layers of insulating material 161-163 are intended to simplistically depict one or more metallization layers that are typically formed above an integrated circuit product so as to provide electrical connection to the underlying integrated circuits formed in the die 180. So as not to obscure the present inventions, the metal lines and via that are formed in such metallization layers are not depicted in the attached drawings.

In accordance with one embodiment, heat may be applied to the PCM material 130 by use of one or more schematically depicted electrical resistance heaters 170 that are coupled to a power source, such as a battery (not shown). As depicted, the electrical resistance heater(s) 170 may be formed in either the die 180 and/or in one or more of the metallization layers. In some applications, one of the electrical resistance heaters may be omitted, e.g., the devices 100/101 may be heated using only a heater(s) 170 that are formed in the die 180. The manner in which such electrical resistance heaters 170 are fabricated are well known to those skilled in the art. In general, depending upon the material selected for the PCM material 130, the electrical resistance heater(s) 170 should be designed such that the temperature of the PCM material 130 may be raised to about 200-300° C. to achieve the desired phase change from an electrically conductive material to an electrically non-conductive material. Depending upon the particular application, the electrical resistance heater(s) 170 should be designed such that they or it can effectuate this desired change in temperature in the PCM material 130 within a time period falling within the range of about 1 µs-10 s (assuming that the PCM material is not colder than 25° C.)

FIG. 5B is a simplistic plan view of the die 180 having five illustrative regions. As depicted, devices 100 and/or 101 are present in regions 2 and 4, but not present in regions 1, 3 and 5. Using the methods disclosed herein, it is not anticipated that each individual nanowire device 100, 101 will be discreetly heated. Rather, it is anticipated that regions of the die 180 that contain such devices 100, 101 will be heated while other regions of the die 180 are not directly heated. Of course, other regions of the die 180 may experience some degree of warming if they are located adjacent a region that is intentionally heated. Thus, in the example depicted in FIG. 5B, the integrated circuit will be designed such that heat may be applied selectively to the regions 2 and 4 (as indicated by the arrows 170) while the regions 1, 3 and 5 are not heated. Of course, the regions 2 and 4 need not be heated at the same time, although that may occur in some situations.

As will be appreciated by those skilled in the art after a complete reading of the present application, various novel devices and methods are disclosed herein. By selectively forming the PCM material 130 on only the nanowire 114A but not on the nanowire 114B, electrical contact to the lower nanowire 114A may be prohibited or at least significantly inhibited by heating the device so as to effectuate the desired phase change in electrical conductivity of the PCM material 130. Accordingly, the methods disclosed herein provide a means to modulate the drive current produced by the devices 100, 101. Thus, when the PCM material 130 is in its conductive phase, the circuit that includes the devices 100, 101 would have an increased current density and thus faster performance. In contrast, when the PCM material 130 is in its substantially non-conductive heated condition, the integrated circuit would be in a quasi "low power consumption" mode wherein it consumes approximately half of the power (for a two nanowire device). Sensing circuitry (not shown) or software may be employed that senses the desired or needed state of performance of the integrated circuit, e.g., senses an operation where a low performance transistor is acceptable. At that point, a controller (not shown) may activate the electrical resistance heater(s) 170 to effectuate the desired heating of the PCM material 130. The sensing circuitry and the controller may be formed on the die 180 or they may reside on another die whereby they are operationally coupled to the die 180 where the heater(s) 170 is/are present.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:
1. A nanowire device comprising:
source/drain regions;
a first nanowire;
a second nanowire positioned above said first nanowire and separated from said first nanowire along its axial length, wherein said first and second nanowires are not axially aligned;
a gate structure positioned around a portion of each of said first and second nanowires; and
a phase change material surrounding at least a portion of said first nanowire in said source/drain regions but not surrounding said second nanowire in said source/drain regions.

2. The device of claim 1, wherein said phase change material is comprised of one of germanium-antimony-tellurium (GST ($Ge_2Sb_2Te_5$), $Te_{81}Ge_{15}S_2As_2$ or $Te_{81}Ge_{15}S_2Sb_2$.

3. The device of claim 1, wherein said phase change material is positioned within an opening in a layer of insulating material and fills a bottom portion of the opening.

4. The device of claim 3, wherein said phase change material has a planar upper surface that is positioned at a level below said second nanowire.

5. The device of claim 3, wherein an upper surface of said phase change material is positioned at a level such that it contacts a material positioned around said second nanowire.

6. The device of claim 3, further comprising a conductive structure that is positioned in said opening around said second nanowire and conductively coupled to an upper surface of said phase change material.

7. The device of claim 1, wherein said phase change material positioned around said first nanowire has a ring-like configuration.

8. The device of claim 7, wherein said ring-like configured phase change material extends along an entire axial length of source/drain portions of said first nanowire.

9. The device of claim 7, further comprising a conductive structure that is positioned in an opening in a layer of insulating material, wherein said conductive structure surrounds said second nanowire and surrounds said ring-like configured phase change material.

10. The device of claim 1, wherein said phase change material is a material that exhibits a decrease in electrical conductivity of at least $10^4$ (in magnitude) when said phase change material is heated from 25° C. to 300° C.

11. A nanowire device comprising:
source/drain regions;
a first nanowire;
a second nanowire positioned above said first nanowire and separated from said first nanowire along its axial length, wherein said first and second nanowires are not axially aligned;
a gate structure positioned around a portion of each of said first and second nanowires;
a phase change material surrounding at least a portion of said first nanowire in said source/drain regions but not surrounding said second nanowire in said source/drain regions, wherein said phase change material is positioned within an opening in a layer of insulating material and fills a bottom portion of said opening; and
a conductive structure that is positioned in said opening in said layer of insulating material around said second nanowire and conductively coupled to an upper surface of said phase change material.

12. The device of claim 11, wherein said phase change material is comprised of one of germanium-antimony-tellurium (GST ($Ge_2Sb_2Te_5$), $Te_{81}Ge_{15}S_2As_2$ or $Te_{81}Ge_{15}S_2Sb_2$.

13. The device of claim 11, wherein said upper surface of said phase change material is a planar upper surface that is positioned at a level below said second nanowire.

14. The device of claim 11, wherein said upper surface of said phase change material is positioned at a level such that it contacts a material positioned around said second nanowire.

15. The device of claim 11, wherein said phase change material is a material that exhibits a decrease in electrical conductivity of at least $10^4$ (in magnitude) when said phase change material is heated from 25° C. to 300° C.

16. A nanowire device comprising:
source/drain regions;
a first nanowire;
a second nanowire positioned above said first nanowire and separated from said first nanowire along its axial length, wherein said first and second nanowires are not axially aligned;
a gate structure positioned around a portion of each of said first and second nanowires;
a ring-like configured phase change material surrounding at least a portion of said first nanowire in said source/drain regions but not surrounding said second nanowire in said source/drain regions, wherein said ring-like configured phase change material extends along an entire axial length of source/drain portions of said first nanowire; and
a conductive structure that is positioned in an opening in a layer of insulating material, wherein said conductive structure surrounds said second nanowire and surrounds said ring-like configured phase change material.

17. The device of claim 16, wherein said phase change material is comprised of one of germanium-antimony-tellurium (GST ($Ge_2Sb_2Te_5$), $Te_{81}Ge_{15}S_2As_2$ or $Te_{81}Ge_{15}S_2Sb_2$.

18. The device of claim 16, wherein said phase change material is a material that exhibits a decrease in electrical conductivity of at least $10^4$ (in magnitude) when said phase change material is heated from 25° C. to 300° C.

* * * * *